(12) United States Patent
Brown (10) Patent No.: US 7,911,235 B2
(45) Date of Patent: Mar. 22, 2011

(54) LOGARITHMIC DETECTORS (75) Inventor: Forrest James Brown, Carson City, NV (US)

(73) Assignee: DockOn AG, Zurich (CH)

( * ) Notice: Subject to any disclaimer, the term of this patent is extended or adjusted under 35 U.S.C. 154(b) by 0 days.

(21) Appl. No.: 12/741,013

(22) PCT Filed: Oct. 31, 2008

(86) PCT No.: PCT/GB2008/051021
§ 371 (c)(1),
(2), (4) Date: Apr. 30, 2010

(87) PCT Pub. No.: WO2009/056889
PCT Pub. Date: May 7, 2009

(65) Prior Publication Data
US 2010/0237935 A1    Sep. 23, 2010

(30) Foreign Application Priority Data
Nov. 1, 2007   (GB) .................................. 0721481.0

(51) Int. Cl.
*G01R 19/00* (2006.01)
*H03B 5/00* (2006.01)
*H03B 5/08* (2006.01)
*H03D 1/00* (2006.01)
*H03D 3/00* (2006.01)

(52) U.S. Cl. .......... 327/51; 329/346; 329/348; 329/349; 331/75; 331/117 R; 331/173

(58) Field of Classification Search .............. 327/50–57; 329/345–349; 331/64, 74, 75, 117 R, 117 FE, 331/117 D, 172, 173, 177 R, 177 V, 179, 331/181
See application file for complete search history.

(56) References Cited

U.S. PATENT DOCUMENTS

| | | | |
|---|---|---|---|
| 3,092,779 A | 6/1963 | De Niet | |
| 3,320,530 A | 5/1967 | Pearlman | |
| 3,791,272 A * | 2/1974 | Nobusawa | ................... 396/228 |

* cited by examiner

*Primary Examiner* — David Mis
(74) *Attorney, Agent, or Firm* — SilverSky Group, LLC (57) ABSTRACT

Disclosed is a logarithmic detector comprising: an amplifier element; means for setting a frequency of operation of the detector; and a controller, wherein an input signal to the amplifier element is arranged to cause an oscillation in the amplifier element, and the controller is operable to sense a pre-determined threshold, indicative of oscillation and, in response to sensing said threshold, to interrupt the oscillation of the amplifier such that the frequency of said interruption is proportional to the logarithm of the power of the input signal.

26 Claims, 6 Drawing Sheets

FIG. 1
PRIOR ART

PRIOR ART

LOGARITHMIC DETECTORS

The present invention relates to logarithmic detectors which find use in a variety of different electronic items, both in the consumer electronics field and in specialised fields such as medical imaging and telecommunications.

In many electronics fields, it is desirable or necessary to detect a very low level signal from amongst other electrical signals which may comprise other transmissions and/or electrical noise. Often, when the wanted signal is at a very low level, it can be swamped by the unwanted signals, which are hereinafter referred to by the generic term "noise".

In a typical application where a low level signal must be detected and processed, very sensitive detectors are required which are capable of discriminating a low level signal from amongst other noise. For instance, in the field of medical imaging, particularly ultrasound scanning, it is desirable to be able to detect a very low level signal which can then be processed to reveal the desired subject, e.g. a foetus or internal organ.

In practical systems, one of the major factors which diminishes the quality of the displayed image is the presence of a large amount of noise which hinders the available resolution.

In another typical prior art system—a cellular telephone system—there are many conflicting demands upon transmit power and quality of receiver. There is a conflict between wanting to transmit as much power as possible to arrive at a receiving device and the desire to minimise transmit power, as this will interfere with and degrade other transmissions in the vicinity of the transmission. At the same time, the receiver is only able to discriminate signals at or above a certain level and this has a direct effect on factors in network planning such as transmitter power, cell size and antenna design. If it were possible to design a receiver capable of receiving a lower level signal more reliably, then the transmit power of the transmitter could be proportionately decreased, resulting in lower levels of interference for neighbouring devices. Also, such a receiver would, in principle, allow large cell sizes to be used, resulting in lower infrastructure costs.

Prior art solutions to such detection problems have used logarithmic amplifiers (hereinafter termed "log amps") in a variety of applications. The defining characteristic of a log amp is that the output signal is a voltage proportional to the logarithm of the input signal. Such devices are found to be particularly useful over a wide dynamic range and particularly for receiving low level input signals. Typical prior art log amps are often provided as individual integrated circuit devices or they may be integrated into a larger custom integrated circuit, such as an ASIC.

However, there are various disadvantages associated with the use of prior art log amps. In particular, the dynamic range of prior art devices can be limited, which means that the voltage output for very high or very low input signals does not conform to the logarithmic relationship expected. This can result in erroneous outputs at extreme input values, and is particularly problematic at the low levels referred to previously.

Another problem with prior art log amps is that thermal noise can interfere severely with signals at the lower end of the operating range. The problems with electrical noise tend to increase when more power is applied to the input circuit which itself causes problems across a wider range of operation.

In very specialised areas, techniques such as refrigerating the entire circuit to reduce the amount of thermal noise have been attempted. Although these can offer a degree of performance improvement, such techniques are not generally applicable and are of limited practical value.

Figure 1:
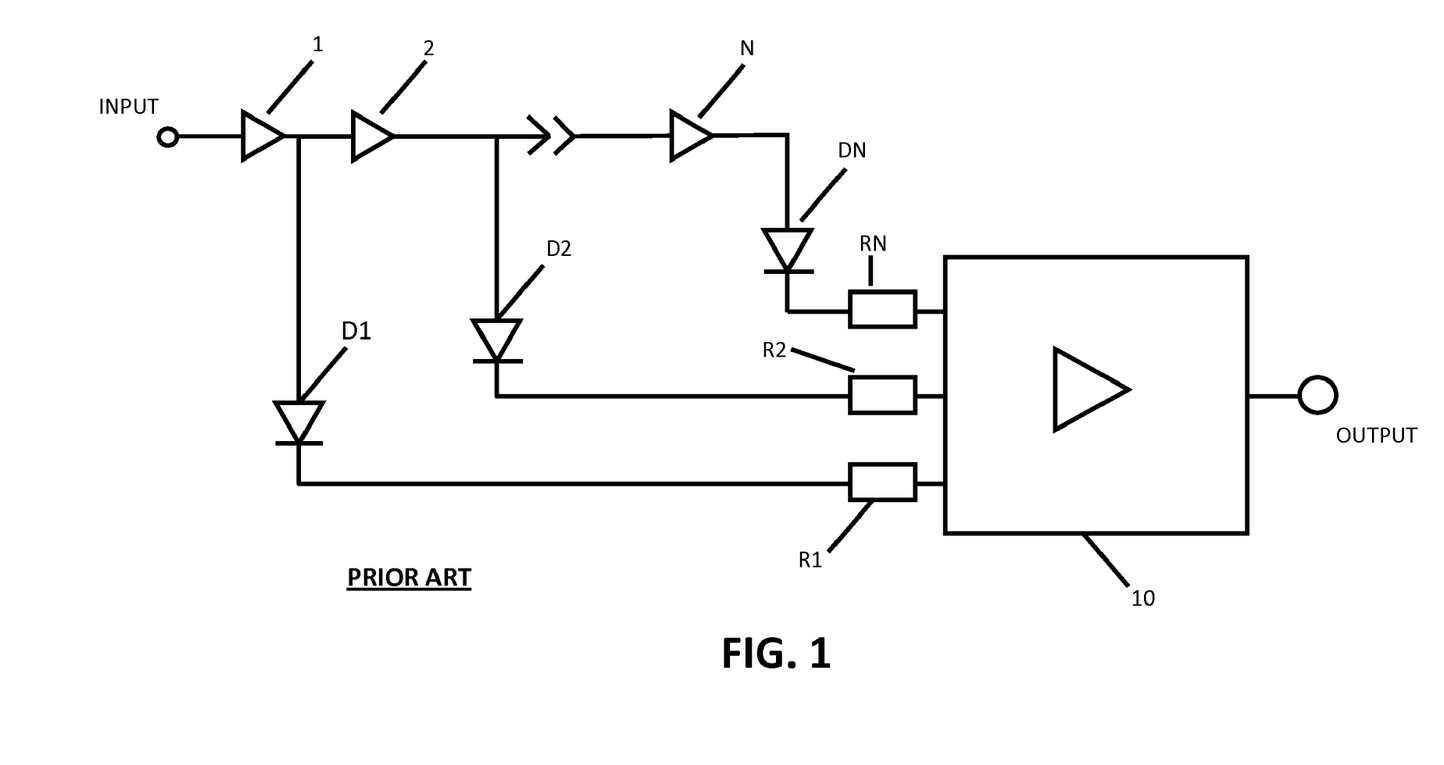
FIG. 1 shows a prior art representation of a log amp.

FIG. 1 shows a typical illustrative configuration of a prior art log amp circuit. This shows that the desired logarithmic response can be achieved by cascading a plurality of gain blocks (amplifiers 1, 2 . . . n) in series. The output of each amplifier stage feeds into the next stage and furthermore, the output of each amplifier passes through a respective diode (D1, D2 . . . Dn) where the individual signals generated thereby added in a summing amplifier 10 with the overall output of that summing amplifier 10 giving the desired logarithmic response.

The circuit shown in FIG. 1 is a rather simplified version of what happens in practice, but gives a good overview of techniques which are employed to achieve the desired logarithmic relationship. It can be seen from examining the circuit at FIG. 1 that differences in the performance of individual components will have an effect on the performance of the amplifier and make it non-ideal. It may be possible to configure this circuit so that it can be tuned with the addition of extra discrete components, but this does not render a solution that is viable for mass production purposes.

A further problem with the prior art log amp shown in FIG. 1 is that it has a very limited range of operation (i.e. it is very frequency dependant) and if the frequency of operation strays too far from the ideal, then the logarithmic performance of the circuit is adversely affected.

Figure 2:
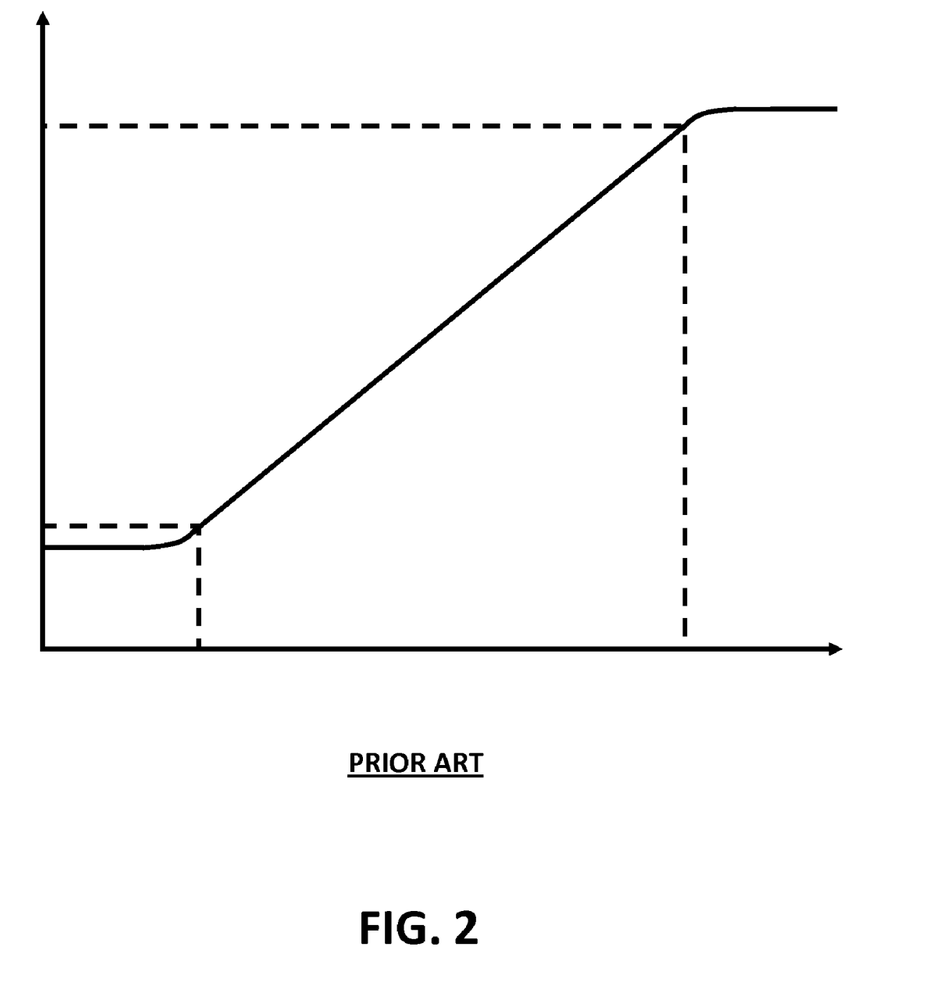
FIG. 2 shows a typical transfer characteristic of a prior art log amp.

FIG. 2 shows a typical transfer characteristic of a prior art log amp. The x-axis shows the input voltage and the y-axis shows the output voltage (in dB). The effective dynamic range (shown by the region between the dotted lines) is represented by the linear portion of the transfer curve, this being the range of input voltages for which a true logarithmic output is generated. Outside of this dynamic range, the output voltage will not be a true logarithm of the input voltage, which limits its use, particularly where low level input signals are concerned.

The aim of embodiments of the present invention is to address problems with prior art log amps, whether discussed herein or not. In particular, embodiments of the present invention aim to ameliorate the problems associated with log amps having a limited dynamic range.

According to an aspect of the present invention there is provided a logarithmic detector comprising: an amplifier element; means for setting a frequency of operation of the detector; and a controller, wherein an input signal to the amplifier element is arranged to cause an oscillation in the amplifier element, and the controller is operable to sense a pre-determined threshold, indicative of oscillation and, in response to sensing said threshold, to interrupt the oscillation of the amplifier such that the frequency of said interruption is proportional to logarithm of the power of the input signal.

Preferably, the amplifier element is a discrete transistor, such as BJT or FET, or an operational amplifier. Alternative amplifier elements could even include vacuum valves.

Preferably, the means for setting the frequency of operation comprises a feedback circuit, connected between the input and output of the amplifier element. The feedback circuit preferable comprises a tuned circuit, such as an L-C or R-C circuit. For variable frequency control, a phase-locked loop (PLL) may be used.

Preferably, the predetermined threshold is determined on the basis of current flow in a power supply to the amplifier element. The threshold current level may be sensed by measuring the voltage across a known resistor.

Preferably, the current flow is measured using an analogue comparator or a Digital to Analogue Convertor (DAC). If the DAC is used, the controller preferably comprises a microprocessor to interpret the result of the current flow measurement.

Preferably, a frequency multiplier may be used to provide a greater number of sample measurement points.

Preferably, the oscillations are interrupted by effectively grounding the input of the amplifier element. Alternatively, the feedback loop may be temporarily broken or power may be temporarily disconnected from the amplifier element.

Preferably, the detector further comprises a frequency to voltage convertor, operable to convert the train of spikes resulting from the interruptions into a dc voltage proportional to the power of the input signal.

According to another aspect of the present invention, there is provided method of detecting a signal comprising the steps of: applying the signal to an amplifier element comprising a frequency-selective feedback circuit, such that the sum of noise and the signal causes the amplifier element to oscillate; and interrupting the oscillation in response to sensing a predetermined threshold indicative of oscillation.

Preferably, the method further comprises the step of converting voltage spikes produced by said interruption into a DC voltage which is directly proportional to the logarithm of the power of the signal.

Preferably, the step of interrupting comprises effectively grounding an input to the amplifier element.

According to a further aspect of the present invention there is provided a logarithmic amplifier comprising: an amplifier element; means for setting a frequency of operation of the logarithmic amplifier; wherein an input signal to the amplifier element is arranged to cause an oscillation in the amplifier element, and means are provided to periodically interrupt the oscillation of the amplifier such that the frequency of said interruption is proportional to the power of the input signal.

Preferably, the frequency of operation is set by an L-C tuned circuit, although other possible configurations may be used.

Preferably, the frequency of interruption is set by an R-C tuned circuit although other possible configurations may be used.

Preferably the frequency of interruption is set to approximately one tenth of the operating frequency.

Preferably a frequency to voltage convertor is provided to provide a DC signal representative of the logarithm of the input power to the log amp.

Other features of the invention will be apparent from the dependent claims, and the description which follows.

For a better understanding of the invention, and to show how embodiments of the same may be carried into effect, reference will now be made, by way of example, to the accompanying diagrammatic drawings in which.

Figure 3:
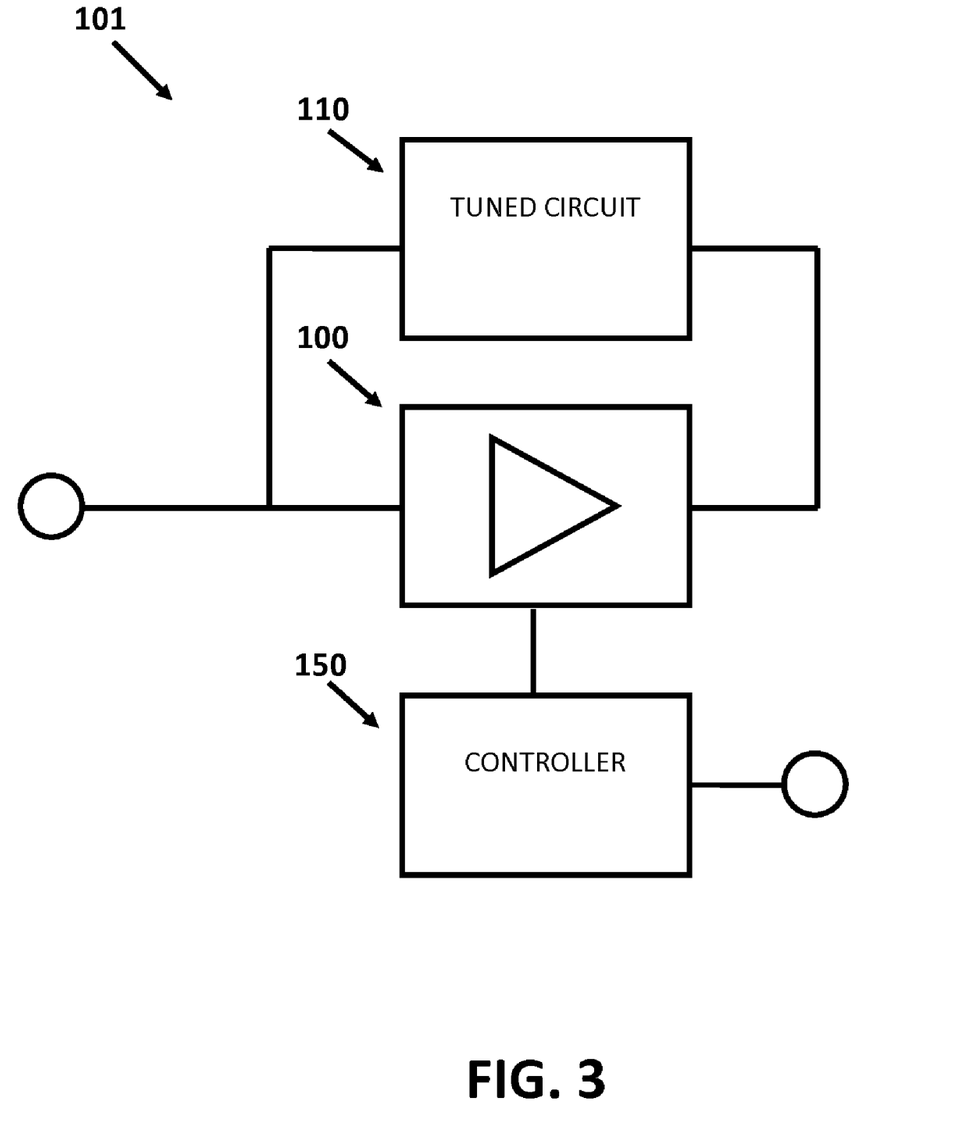
FIG. 3 shows a functional block diagram of a first embodiment of the present invention.

FIG. 3 shows a first embodiment of the present invention. This embodiment comprises a gain element 100 to which the input signal is applied. Provided as a feedback circuit, connecting the output of the gain element 100 to the input of the gain element 100, is a tuned circuit 110, which acts to set a frequency of operation of the circuit.

The entire circuit is controlled by a controller 150, which is operable to control certain operational parameters of the gain block and, from which the output of the circuit is derived.

The input to the gain element 100 is the signal which it is desired to detect. The output of the circuit is taken from the controller 150. The input is typically a low-level RF signal in the presence of electrical noise.

In a 'raw' form, the output signal comprises a series or train of voltage spikes, the periodic frequency of which is related to the logarithm of the power of the input signal. In some applications, it is desirable to make direct use of this train of pulses and process them in either the analogue or digital domain. In other applications, the train can be pre-processed to give an analogue voltage proportional to the logarithm of the power of the input signal.

In a preferred embodiment, the output can be boosted by a known amplifier, which enables the detector 101 to form the basis of a logarithmic amplifier (log amp), which can be used in a variety of different applications.

Figure 4:
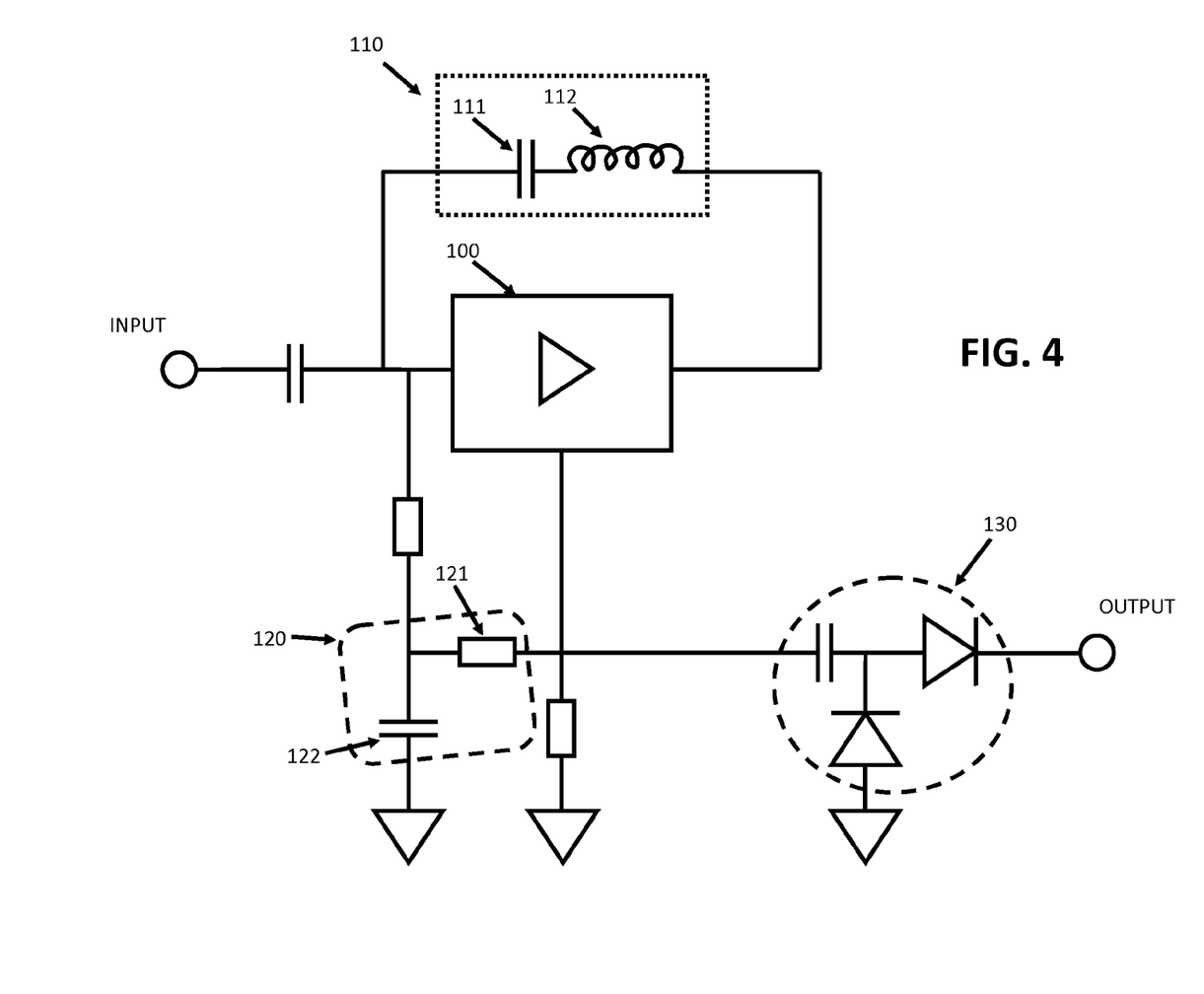
FIG. 4 shows a schematic of a first embodiment of the present invention.

FIG. 4 shows a more detailed schematic view of various elements of the first embodiment of the present invention. The amplifier element 100 at the heart of the system may be any suitable amplifier element, such as an operational amplifier (op-amp), a discrete transistor (such as a BJT, FET or other form of transistor) or even a vacuum valve. Its exact characteristics are relatively unimportant.

Embodiments of the invention effectively operate as controlled oscillators, whereby the oscillation is initiated in the gain element 100 in response to electrical noise and/or a wanted signal. The oscillation is terminated periodically in response to the magnitude of the input signal. The speed of onset of the oscillation and its subsequent termination are indicative of the strength of the input signal, and this is the basic operational method of embodiments of the invention. It has been found that this behaviour enables very low level input signals to be more effectively discriminated amongst electrical noise.

Provided between the output and the input of the amplifier element 100 is a first feedback circuit 110 which is operable to control a frequency of operation of the circuit. In the embodiments shown in FIG. 4, the feedback circuit is a tuned circuit in the form of a simple series L-C circuit (comprising capacitor 111 and inductor 112), where the frequency of operation is determined by the formula:

$$f = \frac{1}{2\pi\sqrt{LC}}$$

The frequency of operation of the circuit is selected as required by the particular application for which the detector is to be used. Other forms of tuned circuit using, for instance, crystals or resonators, can also be used in a known manner. Variable tuning circuits, such as Phase-Locked Loops (PLLs) can also be used to provide a circuit operable over a range of different frequencies.

Electrical noise at the input of the amplifier 100 will set up oscillations in the circuit at the frequency determined by L and C, as given above. Noise outside the bandwidth of the L-C tuned circuit will have minimal effect on the operation of the circuit. The Q of the circuit is determined on the basis of the components in the tuned circuit. A high-Q circuit may be formed by use of a crystal resonator, for instance.

Incoming signals lying within the bandwidth of the L-C tuned circuit will cause the oscillator to commence oscillation more rapidly than if random noise alone were exciting the circuit. As such, wanted signals having the desired frequency cause oscillations to occur more quickly than will random noise alone.

By way of illustration, it is useful to examine the effect of the Q of the tuned circuit on the oscillation performance of the circuit. If the tuned circuit 110 has a Q of 100, then approximately 100 cycles of input signal will need to pass through the amplifier element 100 before oscillation begins. This is regardless of whether the input signal is a wanted signal or just noise. However, once the amplifier enters oscillation mode, it will continue to oscillate until some external event stops it. In the event that there is only random noise at the input, the level of the oscillation will build relatively slowly over time until a threshold is reached, at which point the control circuit 150 acts to terminate the oscillation.

In the event that there is a wanted signal amongst the noise, the relative level of input signal is higher and the threshold will be reached sooner than would be the case for random noise alone. As will be understood, the higher the level of the wanted signal, the sooner the threshold is reached and so the interruption of the oscillation is more frequent.

There now follows a more detailed description of how the controller operates to interrupt oscillation.

In addition to the feedback circuit 110, there is provided a controller 150, comprising elements 120 and 130. Functional element 120 is arranged to interrupt the oscillation of the amplifier element 100 periodically. Functional element 120 comprises an RC circuit comprising resistor 121 and capacitor 122. The arrangement of functional element 120 effectively samples the current flowing in the voltage supply line to the amplifier element 100 and once this reaches a pre-determined level, the effect is to instantaneously ground the input to the amplifier, which causes the oscillations to cease. In effect, functional element 120 is acting as an analogue sampling circuit which is used to periodically interrupt the operation of the amplifier element 100 once a threshold is reached.

If the amplifier is not in oscillation, then the current drawn by it is relatively small. Once oscillation commences, the current drawn increases significantly. By selecting the threshold appropriately, the oscillation can be interrupted frequently enough to adequately detect the input signal.

The functional element 130 acts as a frequency to voltage converter. The input to the frequency to voltage converter 130 comprises a series of voltage spikes and the output from the frequency to voltage converter is a DC voltage which is proportional to the frequency of the input spikes. The spikes result from the manner in which the power drawn by the amplifier element 100 increases in response to an input signal an/or noise and how it is suddenly stops once the predetermined threshold is reached.

The output of the frequency to voltage converter is a DC voltage signal that varies as the logarithm of the power of the input signal. This utilises a physical property of the circuit elements directly and does not require any explicit logarithmic calculations or estimations to be made. This is a major reason for the superior performance of embodiments of the invention.

In alternative embodiments of the invention, a frequency to voltage converter may be omitted and the train of voltage spikes can be processed in an alternative way e.g. by a Digital Signal Processor.

Figure 5:
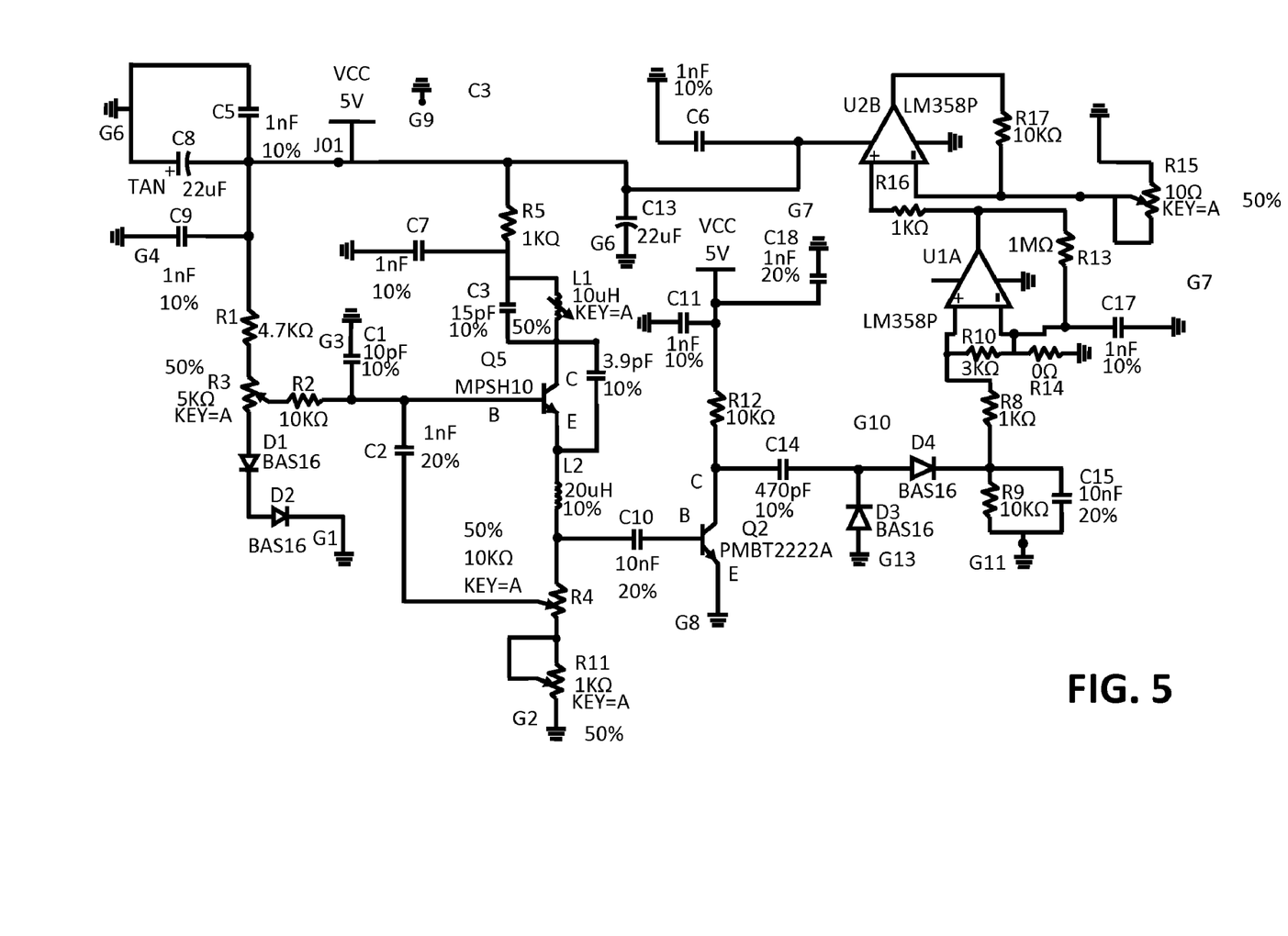
FIG. 5 shows a schematic of a second embodiment of the present invention.
Figure 6:
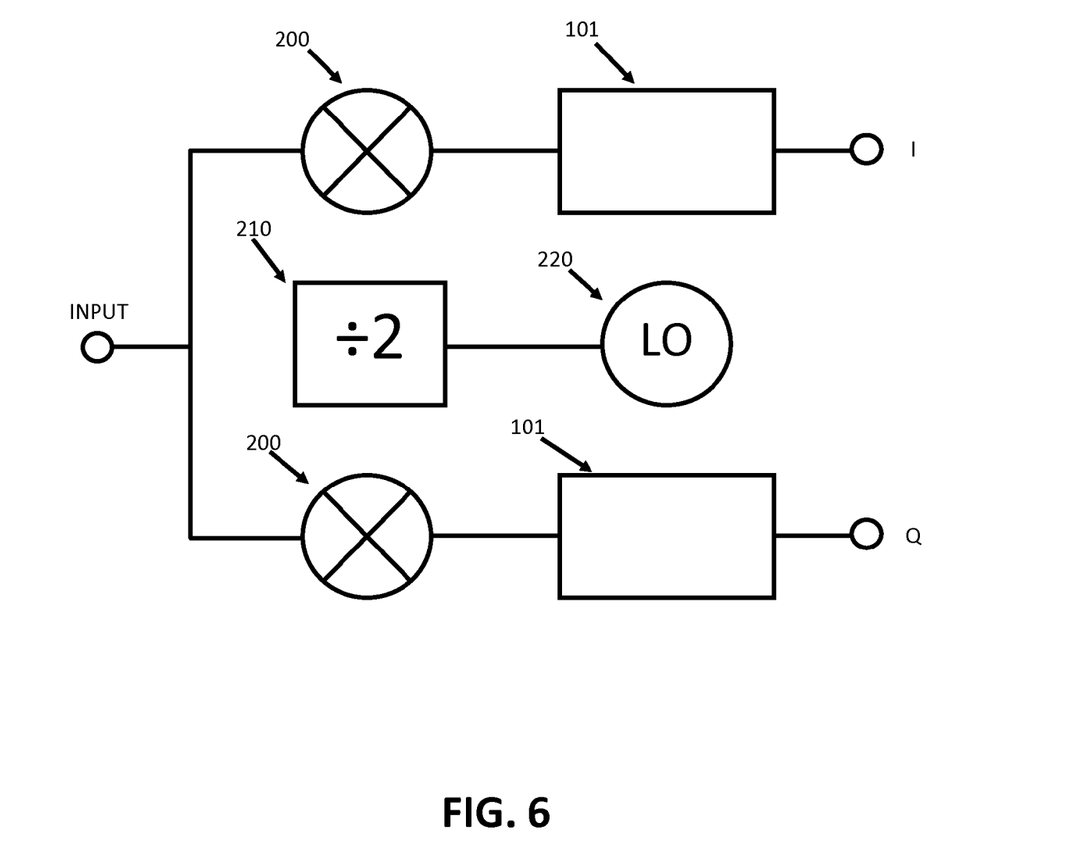
FIG. 6 shows an I/Q demodulator according to an embodiment of the present invention.

The embodiments shown in FIGS. 4 to 6 are purely analogue circuits. Functional element 120 and its equivalents in the other figures effectively acts as an analogue sampler, which detects when the current drawn by the amplifier element 100 reaches a certain threshold and then acts to interrupt the oscillation. Of course, it is possible to perform these operations digitally and a digital sampler, comprising an Analogue to Digital Converter (ADC) can be used in place of the purely analogue solution shown. The Controller 150 in this case comprises a microprocessor operable to read the output of the DAC and interrupt the oscillation of the amplifier in response to a threshold being reached.

Other techniques for interrupting the oscillation of the amplifier element 100 can be used, These include grounding the input to the amplifier, breaking the feedback loop or removing power from the amplifier element.

In a further enhancement, improved performance can be achieved by use of a frequency multiplier in the functional element 120. This allows more frequent samples of the current drawn by the amplifier element to be taken, resulting in a quicker reaction to the onset of oscillation. It is found that this further improves the ability of embodiments of the invention to detect low-level input signals. In the analogue domain, the frequency multiplier can take the form of a monostable multivibrator (a 'one-shot'). In the digital domain, the sample rate of the ADC can be adjusted so that samples are taken more frequently and an optimum level can be obtained for a particular situation. A certain amount of trial and error can be used to find the correct balance between triggering too soon, before oscillation is properly established, and too late, when resolution will be lost.

A log detector according to an embodiment of the invention is able to better discriminate a wanted signal from background noise, since a wanted signal at the input to the log detector sums with the inherent noise, causing the amplifier to oscillate more speedily, which is indicative of a larger signal at the input. In empirical measurements, it has been found that a log detector according to an embodiment of the present invention is able to detect wanted input signals approximately 10 dB below those able to be detected using sophisticated prior art spectrum analyser tools. Such an increase in performance in the detector allows improved performance throughout entire systems when such a detector is employed within them.

The technique which has been described above is believed to be entirely novel and allows a log detector to be constructed which benefits from improved performance whilst requiring no special calibration or cooling equipment. Since the amplifier element 100 of the log detector circuit is not directly amplifying the signal, the absolute performance characteristics of this device are not critical to the overall performance of the log detector, as would be the case with prior art devices, such as that shown in FIG. 1.

Rather, the operation of the circuit can be best understood to be a detector, which is sensitive to the logarithm of the input power and which outputs a DC voltage signal directly proportional to said logarithm.

The invention may be embodied in many different forms, and a preferred technique is to fabricate all the necessary components onto a single chip using known fabrication techniques. In this way, the benefit of the invention can be easily incorporated into a range of different applications.

FIG. 5 shows a schematic of a second embodiment of the present invention. This embodiment shows a full realisation of a log detector according to an embodiment of the present invention. The key components included in this schematic are: Q5, which acts as the gain element/oscillator; L1 and C3 which are the tuned circuit which set the operating frequency of the circuit; C14, D3 and D4 which act as a frequency to voltage converter; and U1A and U2B which act as level converters and filters to condition the output signal for further use. Other components are operating in a standard way and the skilled person will readily understand their functions.

Examples of different areas that could benefit from embodiments of the invention are described in some detail below.

An I/Q demodulator using a log detector according to an embodiment of the present invention is able to detect and demodulate signals at a lower signal level than is currently possible. FIG. 6 shows a sample arrangement using a pair of log detectors 101 according to an embodiment of the present invention. The remainder of the demodulator circuit is identical to the prior art, and the skilled person will readily understand how to integrate a log detector according to an embodiment of the present invention. It comprises a Local Oscillator (LO) 220 which feeds into a frequency divider 210, having two complementary outputs, each of which feed respective Double Balanced Mixers 200. Each mixer is further fed with the input signal. Each mixer mixes down the input signal to a baseband signal or an intermediate frequency (IF), and then feeds the signal to one of a pair of log detectors 101. The outputs from the pair of log detectors are, respectively in-phase (I) and quadrature (Q) signals.

Such an I/Q demodulator can be used in a variety of different system employing one or more of many different digital modulation schemes.

By use of an I/Q demodulator according to an embodiment of the present invention, the improvement in receiver performance over prior art receivers could be as much as 10 dB i.e. signals 10 db lower than at present can be received and processed. The factor of 10 db include in link budget calculations makes a significant difference to system performance and planning. For instance, if a cellular telecommunication system were implemented using embodiments of the present invention, then the improvement in receiver performance alone would allow for either larger cell sizes, resulting in fewer base stations being required or for more channels to be supported by a given base station. Either of these options, or a mixture of the two, offers significant savings in infrastructure costs.

The I/Q demodulator of FIG. 6 can be employed in a variety of different telecommunication fields. Other examples include RADAR, where the improved reception performance offers the prospect of increased resolution and/or range.

Other areas which can benefit from log detectors according to embodiments of the invention include: ground-penetrating RADAR, which is used in geological and archaeological research; medical imaging, including ultrasound imaging, Magnetic Resonance Imaging (MRI) and CAT-scans; laboratory equipment, such as spectrum analysers, network analysers and oscilloscopes.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. A logarithmic detector, comprising:
an amplifier element receiving an input signal, oscillating the input signal, generating a first output signal, and having a current sample signal, the input signal including a signal to be detected and electrical noise;
a feedback circuit establishing a frequency at which the amplifier element will oscillate the input signal, the feedback circuit receiving the first output signal and generating a feedback signal coupled to the input signal;
a controller receiving and sampling the current sample signal and terminating oscillation of the input signal once a pre-determined threshold of the current sample signal is detected, the controller generating a second output signal that includes a series of voltage spikes resulting from the amplifier element commencing oscillation and the controller terminating oscillation of the input signal at a rate proportional to the log of the power of the input signal; and
a frequency to voltage converter receiving the second output signal and generating a third output signal that is a DC signal proportional to the input signal.

2. The logarithmic detector as recited in claim 1, wherein the amplifier element is an operational amplifier.

3. The logarithmic detector as recited in claim 1, wherein the amplifier element is a discrete transistor.

4. The logarithmic detector as recited in claim 1, wherein the amplifier element is a vacuum valve.

5. The logarithmic detector as recited in claim 1, wherein the feedback circuit is a tuned circuit.

6. The logarithmic detector as recited in claim 5, wherein the tuned circuit is a variable tuning circuit.

7. The logarithmic detector as recited in claim 6, wherein the variable tuning circuit is a phase-locked loop.

8. The logarithmic detector as recited in claim 1, wherein the controller includes an RC circuit that terminates oscillation of the input signal by grounding the input signal once the pre-determined threshold of the current sample signal is detected.

9. The logarithmic detector as recited in claim 1, wherein the controller terminates oscillation of the input signal by breaking the feedback circuit.

10. The logarithmic detector as recited in claim 1, wherein the controller terminates oscillation of the input signal by removing power from the amplifier element.

11. The logarithmic detector as recited in claim 1, wherein an analogue comparator detects the pre-determined threshold of the current sample signal.

12. The logarithmic detector as recited in claim 1, wherein a digital to analogue convertor detects the pre-determined threshold of the current sample signal.

13. The logarithmic detector as recited in claim 1, wherein the controller includes a frequency multiplier increasing a rate at which the current sample signal is sampled.

14. A method of detecting a signal, comprising the steps of:
receiving an input signal with an amplifier element, the input signal including the signal and electrical noise;
establishing a frequency at which the amplifier element will oscillate the input signal;
oscillating the input signal at the frequency;
generating a first output signal;

generating a feedback signal coupled to the input signal based on the first output signal;

sampling a current sample signal at a rate;

terminating oscillation of the input signal once a pre-determined threshold of the current sample signal is detected; and generating a second output signal, the second output signal including a series of voltage spikes resulting from the step of oscillating the input signal and the step of terminating oscillation of the input signal at a rate proportional to the log of the power of the input signal.

15. The method as recited in claim 14, further comprising the step of converting the second output signal into a DC signal proportional to the input signal.

16. The method as recited in claim 14, wherein the step of terminating oscillation comprises the step of grounding the input signal.

17. The method as recited in claim 14, wherein the step of terminating oscillation comprises the step of breaking a feedback circuit generating the feedback signal.

18. The method as recited in claim 14, wherein the step of terminating oscillation comprises the step of removing power from the amplifier element.

19. The method as recited in claim 14, wherein the amplifier element is an operational amplifier.

20. The method as recited in claim 14, wherein the amplifier element is a discrete transistor.

21. The method as recited in claim 14, wherein the amplifier element is a vacuum valve.

22. The method as recited in claim 14, wherein the feedback signal is generated by a tuned circuit.

23. The method as recited in claim 14, wherein the step of sampling a current sample signal at a rate includes the step of multiplying the rate at which the current sample signal is sampled.

24. A logarithmic detector, comprising:

an amplifier element receiving an input signal, oscillating the input signal, generating a first output signal, and having a current sample signal, the input signal including a signal to be detected and electrical noise;

a feedback circuit establishing a frequency at which the amplifier element will oscillate the input signal, the feedback circuit receiving the first output signal and generating a feedback signal coupled to the input signal;

a controller receiving and sampling the current sample signal and terminating oscillation of the input signal once a pre-determined threshold of the current sample signal is detected, the controller generating a second output signal that includes a series of voltage spikes resulting from the amplifier element commencing oscillation and the controller terminating oscillation of the input signal at a rate proportional to the log of the power of the input signal; and a digital signal processor receiving the second output signal and generating a third output signal that is a DC signal proportional to the input signal.

25. The logarithmic detector as recited in claim 24, wherein the controller is a microprocessor and includes a digital to analog converter (DAC) measuring the current sample signal and generating a DAC output, wherein the microprocessor interprets the DAC output signal to generate the second output signal.

26. The logarithmic detector as recited in claim 24, wherein the controller includes a frequency multiplier increasing a rate at which the current sample signal is sampled.

* * * * *